United States Patent [19]
Takahashi et al.

[11] Patent Number: 5,835,284
[45] Date of Patent: Nov. 10, 1998

[54] CATADIOPTRIC OPTICAL SYSTEM AND ADJUSTING METHOD

[75] Inventors: Tetsuo Takahashi, Kawasaki; Yasuhiro Omura, Tokyo, both of Japan

[73] Assignee: Nikon Corporation, Tokyo, Japan

[21] Appl. No.: 882,939

[22] Filed: Jun. 26, 1997

[30] Foreign Application Priority Data

Jun. 28, 1996  [JP]  Japan .................................... 8-188365

[51] Int. Cl.$^6$ .................................................. G02B 17/08
[52] U.S. Cl. ........................... 359/726; 359/730; 359/732
[58] Field of Search ..................................... 359/726–732

[56] References Cited

U.S. PATENT DOCUMENTS 5,668,673   9/1997   Suenga et al. ........................... 359/727

FOREIGN PATENT DOCUMENTS 6-331932   12/1994   Japan .

*Primary Examiner*—Georgia Y. Epps
*Assistant Examiner*—Michael A. Lucas
*Attorney, Agent, or Firm*—Michael N. Meller

[57] ABSTRACT

A catadioptric optical system in which a first imaging optical system is constructed of a unidirectional optical apparatus which transmits outgoing light from a first plane in one direction only and a bidirectional optical apparatus for transmitting the light that enters and reflecting the same to form an interim image of the first plane. A light guide guides the light from the interim image to a second imaging optical system through which the interim image is reimaged on a second plane. The unidirectional optical apparatus has an optical axis and at least one lens movable along the optical axis.

8 Claims, 5 Drawing Sheets

CATADIOPTRIC OPTICAL SYSTEM AND ADJUSTING METHOD

BACKGROUND OF THE INVENTION

The present invention relates to a catadioptric optical system and a method for adjusting the system. More particularly, the present invention relates to a system in which a pattern on an object in a first plane is superimposingly photo-printed first as an interim image and then onto an object in a second plane, and to a method of adjusting such optical system.

A catadioptric optical system (U.S. Pat. No. 4,779,966) has been proposed for correcting curvature of field and magnification chromatic aberration in a projection exposure apparatus used in lithographic processing during the manufacturing of semiconductor devices and the like.

In a projection exposure apparatus having a catadioptric optical system, the aberration in the projection optical system is substantially measured during assembly of optical members for the projection optical system. Micro adjustments are performed using the following methods: adjusting the distances between the optical members by varying the thickness of the washer arranged between lens cylinders which hold each of the optical members; tilting the optical members (rotating them around the axis perpendicular to the optical path); and shifting the optical members (in the direction perpendicular to the optical axis). These adjustments minimize the deterioration of optical function which is normally caused during assembly of the optical members.

Further, a magnification correction optical system has been proposed (Kokai H6-331932) for the catadioptric optical system which is relatively close to unit magnification.

However, the above-mentioned optimal aberration correction system has not been established for a catadioptric optical system for reduction with a relatively large exposure area and a large numerical aperture (N.A.)

SUMMARY OF THE INVENTION

It is accordingly an object of the present invention to overcome the problems developed in prior art solutions.

It is a further object of the present invention to correct each optical aberration in a catadioptric optical system by positioning the aberration correction system at an optimal location for easy correction.

In order to achieve the above objectives, the apparatus incorporating the principles of the present invention provides a catadioptric optical system in which:

a first imaging optical system has a unidirectional optical apparatus which transmits outgoing light from a first plane only, and a bidirectional optical apparatus arranged to receive light transmitted by the unidirectional apparatus and to reflect such light to form an interim image of the first plane;

a light guide is arranged to guide the light from the interim image to a second imaging optical system through which the interim image is reimaged on a second plane. The unidirectional optical apparatus has an optical axis and at least one lens which is movable with the respect to the optical axis thereof. In an embodiment of the present invention, the lens is movable along the optical axis.

In another embodiment, the lens is movable in a direction perpendicular to the optical axis.

In a further embodiment, the lens is rotatable about an axis perpendicular to the optical axis.

In a preferred embodiment of the present invention, the bidirectional optical apparatus includes a concave mirror and a lens group which transmits both incident light and reflected light with respect to the concave mirror.

In general, the coefficient of aberrations which are symmetric around the optical path is expressed in the following equation (1):

$$N = \sum_{i=1}^{k} N_i \qquad (1)$$

where N is a coefficient of the total optical system aberration for each aberration, $N_i$ is a coefficient of the aberration at each lens surface i for each aberration, and k is the total number of lens surfaces i along the optical axis. Each surface of the lenses in the bidirectional optical system contributes twice to each of the aberration coefficients $N_i$. Therefore, it is difficult to correct independently the axially symmetrical aberrations using each lens surface in the bidirectional optical apparatus. The apparatus incorporating the principles of the present invention, however, provides various aberration correction mechanisms in the unidirectional optical apparatus to provide easy correction of the axially symmetrical aberrations.

The coefficient of eccentric aberrations which are asymmetric around the optical path is only affected by the coefficient of the aberrations which are produced, when one element is shifted or tilted, by the shifted or tilted element or the elements behind it. In the reflective-refractive optical system in which the exposure area is relatively large and the N.A. is large, in general, the aberrations at the interim imaging position, where higher aberrations are easily developed, in particular are not completely corrected. For this reason, even if an adjustment mechanism that uses eccentricity is arranged near the interim image, it is easy to generate higher aberrations and difficult to correct the eccentric aberrations. However, when paying attention to an entire reflective-refractive optical system, it is possible to design a system in which the aberration is substantially corrected.

If, besides correcting the total aberration in the entire reflective-refractive optical system as much as possible in advance, eccentric aberration correction mechanisms are provided in the unidirectional optical apparatus, eccentric aberrations are produced only by the eccentric aberrations generated in the aberration correction mechanisms. This is because the unidirectional optical apparatus is arranged as the last row of lenses when the relationship between the object and the image is reversed going down the optical path backward. In addition, when the eccentric aberration correction mechanisms are provided in the unidirectional optical apparatus, the aberrations are corrected with a small number of elements. For this reason, a higher aberration coefficient rarely occurs.

In the apparatus incorporating the principles of the present invention, as described above, various aberration correction mechanisms are provided in the unidirectional optical apparatus of the first imaging optical system. By adjusting these aberration correction mechanisms, both axially symmetric aberrations and eccentric aberrations can be easily corrected.

BRIEF DESCRIPTION OF THE DRAWINGS

The above and other objects, features, and advantages of the present invention will become more apparent from the following detailed description taken with the accompanying drawings, in which.

DESCRIPTION OF THE PREFERRED EMBODIMENTS

Figure 1:
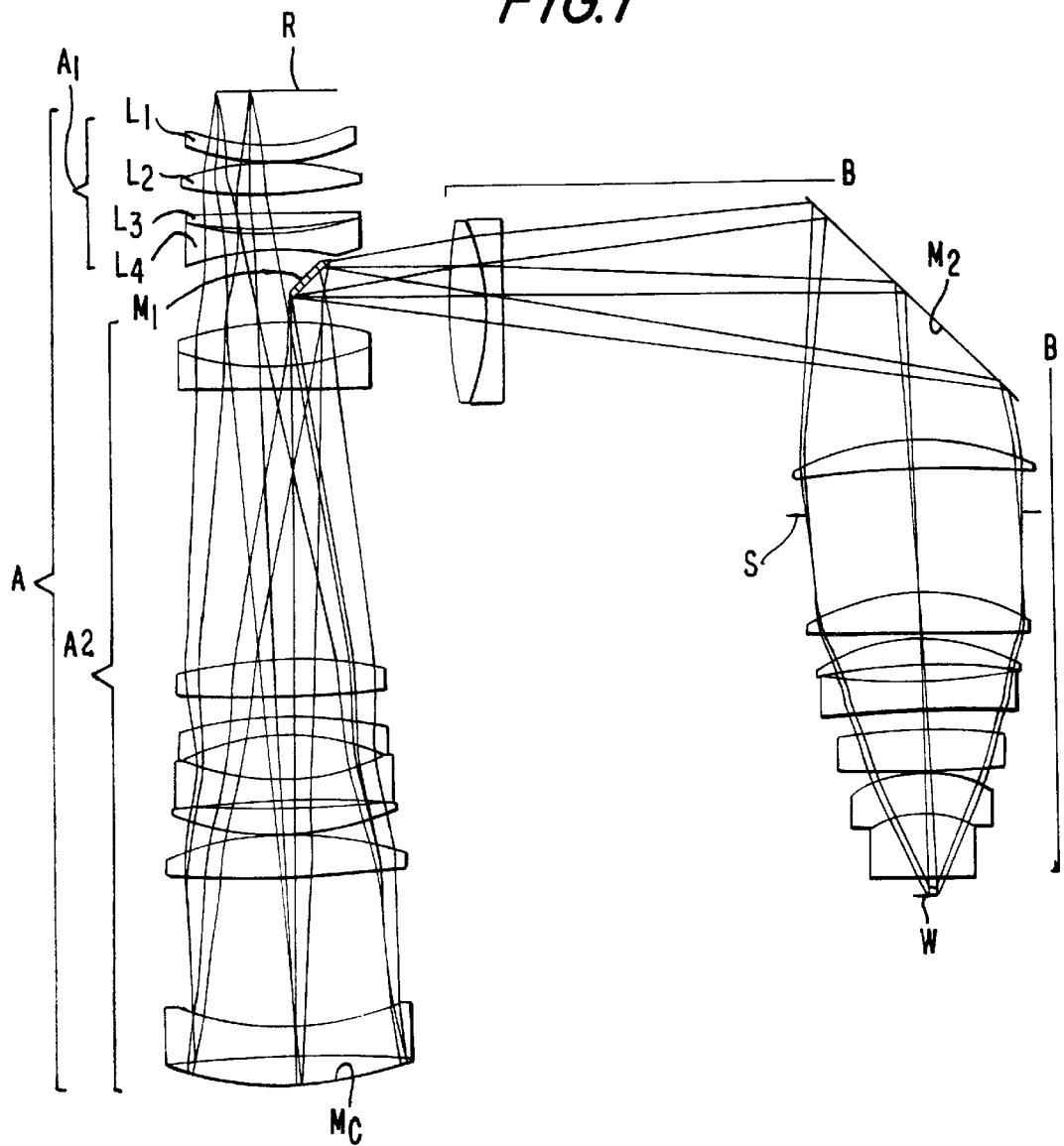
FIG. 1 is a schematic drawing showing the construction of an embodiment of the present invention.

Referring to the drawings, and more particularly to FIG. 1, an embodiment of the present invention is illustrated. This reflective-refractive optical system is applied to a projection optical system in which a circuit pattern on a reticle R in a first plane is reduced and transferred onto a photosensitive surface of a semiconductor wafer W in a second plane. This projection optical system is constructed with a first imaging optical system A, in which an interim image of the pattern on the reticle R is formed. The system further includes a first mirror $M_1$ arranged in the vicinity of the interim image, and a second imaging optical system B, in which the interim image is reimaged on the wafer W.

The first imaging optical system A is constructed of a unidirectional optical apparatus $A_1$ having an optical axis perpendicular to the first plane containing the reticle R and which transmits outgoing light from the reticle R in one direction only, and a bidirectional optical apparatus $A_2$ which transmits the light from the unidirectional optical path $A_1$ in two directions. In the bidirectional optical system $A_2$, a concave mirror $M_c$ is provided so as to reflect the light incident thereon from the unidirectional optical apparatus $A_1$. The lens closest to the concave mirror $M_c$ is a concave lens. The light passing through the bidirectional optical apparatus on its return path is guided to the second imaging optical system B by the first mirror $M_1$. An aperture stop S is provided in the second imaging optical system B, and a second mirror $M_2$ is arranged in the optical path before the aperture stop S.

The exposure range of the reflective-refractive optical system is in a slit or arc shape so that the optical path is confined to such slit or arc shape. By synchronously scanning the reticle R and the wafer W, a large exposure area on the wafer W can be obtained.

Table 1 below shows the parameters of the optical members of this embodiment. In this table, the first column represents the number of the optical surface as counted from the reticle R. The second column, r, represents the radius of curvature for each optical surface. The third column, d, represents the distance between adjacent optical surfaces. The fourth column represents the material of each lens, and the fifth column represents the group number of each optical member. In the fifth column, the asterisk mark (*) represents the light traveling along the return path. Note that the following shows the refractive indices, n, of fused quartz ($SiO_2$) and fluorite ($CaF_2$) with respect to the standard wavelength used (193 nm).

$SiO_2$: n=1.56019

$CaF_2$: n=1.50138

TABLE 1

| | r | d | | |
|---|---|---|---|---|
| 0 | — | 60.000 Reticle R | | |
| 1 | −210.000 | 18.000 $SiO_2$ | $A_1$ | $L_1$ |
| 2 | −233.058 | 1.734 | | |
| 3 | 301.818 | 32.109 $CaF_2$ | $A_1$ | $L_2$ |
| 4 | −415.393 | 19.449 | | |
| 5 | 154862.242 | 15.248 $SiO_2$ | $A_1$ | $L_3$ |
| 6 | −528.109 | 5.460 | | |
| 7 | −316.309 | 18.000 $SiO_2$ | $A_1$ | $L_4$ |
| 8 | 275.570 | 74.064 | | |
| 9 | 342.313 | 48.000 $CaF_2$ | $A_2$ | |
| 10 | −248.024 | 1.806 | | |
| 11 | −250.000 | 20.000 $SiO_2$ | $A_2$ | |
| 12 | 3438.110 | 286.849 | | |
| 13 | 390.013 | 40.000 $CaF_2$ | $A_2$ | |
| 14 | −2017.162 | 22.849 | | |
| 15 | 421.041 | 20.000 $SiO_2$ | $A_2$ | |
| 16 | 230.317 | 47.916 | | |
| 17 | −222.542 | 20.000 $SiO_2$ | $A_2$ | |
| 18 | 988.626 | 7.270 | | |
| 19 | −11949.023 | 27.617 $CaF_2$ | $A_2$ | |
| 20 | −328.913 | 0.500 | | |
| 21 | 365.306 | 42.285 $SiO_2$ | $A_2$ | |
| 22 | −1713.365 | 160.144 | | |
| 23 | −283.704 | 30.000 $SiO_2$ | $A_2$ | |
| 24 | 1076.349 | 30.701 | | |
| 25 | −353.136 | 30.701 Concave mirror $M_c$ | $A_2$ | |
| 26 | 1076.349 | 30.000 $SiO_2$ | $A_2$* | |
| 27 | −283.704 | 160.144 | | |
| 28 | −1713.365 | 42.285 $SiO_2$ | $A_2$* | |
| 29 | 365.306 | 0.500 | | |
| 30 | −328.913 | 27.617 $CaF_2$ | $A_2$* | |
| 31 | −11949.023 | 7.270 | | |
| 32 | 988.62.6 | 20.000 $SiO_2$ | $A_2$* | |
| 33 | −222.542 | 47.916 | | |
| 34 | 230.317 | 20.000 $SiO_2$ | $A_2$* | |
| 35 | 421.041 | 22.849 | | |
| 36 | −2017.162 | 40.000 $CaF_2$ | $A_2$* | |
| 37 | 390.013 | 286.849 | | |
| 38 | 3438.110 | 20.000 $SiO_2$ | $A_2$* | |
| 39 | −250.000 | 1.806 | | |
| 40 | −248.024 | 48.000 $CaF_2$ | $A_2$* | |
| 41 | 342.313 | 4.064 | | |
| 42 | ∞ | 180.000 First mirror $M_1$ | | |
| 43 | 506.214 | 34.041 $CaF_2$ | B | |
| 44 | −256.332 | 3.017 | | |
| 45 | −250.000 | 20.000 $SiO_2$ | B | |
| 46 | −1453.242 | 422.966 | | |
| 47 | ∞ | 150.000 Second mirror $M_2$ | | |
| 48 | −285.380 | 30.000 $SiO_2$ | B | |
| 49 | −954.824 | 50.000 | | |
| 50 | — | 78.332 Aperture Stop S | | |
| 51 | −220.000 | 45.000 $CaF_2$ | B | |
| 52 | −2665.536 | 6.535 | | |
| 53 | −200.000 | 27.411 $SiO_2$ | B | |
| 54 | −516.467 | 18.844 | | |
| 55 | 632.373 | 30.000 $SiO_2$ | B | |
| 56 | −1060.585 | 19.112 | | |
| 57 | −553.788 | 45.000 $SiO_2$ | B | |
| 58 | 5823.302 | 0.500 | | |
| 59 | −153.299 | 45.000 $SiO_2$ | B | |
| 60 | −120.000 | 1.243 | | |
| 61 | −125.615 | 66.000 $SiO_2$ | B | |
| 62 | 3036.218 | 17.000 | | |
| 63 | — | Wafer W | | |

The unidirectional optical apparatus $A_1$ comprises, in sequence from the reticle R side, a meniscus lens $L_1$ whose concave surface faces the reticle R, a first biconvex lens $L_2$, a second biconvex lens $L_3$, and a biconcave lens $L_4$. Each of these lenses has an aberration correction mechanism attached. In other words, the lenses $L_1$, $L_2$, and $L_3$ are arranged integrally movable along the optical axis which extends perpendicular to the reticle R. The lens $L_1$ is also independently movable along the optical axis.

The lenses $L_1$, $L_2$, $L_3$, and $L_4$ are also arranged integrally rotatable around an axis perpendicular to the optical axis. The lenses $L_1$, $L_2$, and $L_3$ are also integrally rotatable around an axis perpendicular to the optical axis; and further, the lens $L_1$ is independently rotatable around an axis perpendicular to the optical axis.

Table 2 below shows the changes in the maximum image height $Y_{10}$ and astigmatism $\Delta_{m-s}$ when the lens $L_1$ is independently moved along the optical axis and when the lenses $L_1$, $L_2$, and $L_3$ are integrally moved.

TABLE 2

| | Amount of displacement in the optical axial direction: $-100 \times 10^{-3}$ | |
|---|---|---|
| | $Y_{10}$ ($\times 10^{-3}$) | $\Delta_{m-s}$ ($\times 10^{-3}$) |
| $L_1$ | 0.392 | 0.087 |
| $L_1, L_2, L_3$ | -4.141 | -0.228 |

If the maximum image height $Y_{10}$ after construction of the optical system is taller by y than the value of the real object, and the astigmatism is generated by $\Delta$, the following simultaneous equations (2) and (3) are to be satisfied in order to maximize the image height and to make the astigmatism $\Delta_{m-s}$ zero by integrally shifting the lenses $L_1$, $L_2$, and $L_3$ along the optical axis:

$$0.392/(-100) \cdot z_1 - 4.141/(-100) \cdot z_{1-3} = -y \quad (2)$$

$$0.087/(-100) \cdot z_1 - 0.228/(-100) \cdot z_{1-3} = -\Delta \quad (3)$$

By solving the above simultaneous equations, the amount of displacement $z_1$ and $z_{1-3}$ can be obtained, the maximum image height $Y_{10}$ is made to be the original value, and the astigmatism $\Delta_{m-s}$ to be zero.

Table 3 below shows the changes in m-dis (deviation of the imaging point of the maximum image height in a plane which includes the optical axis and is perpendicular to the rotation axis), s-dis (deviation of the image point of the maximum image height in a plane which includes both the optical axis and the rotation axis), and astigmatism $\delta_{m-s}$, which is optical-axially asymmetric, for each of the following conditions: when the lens $L_1$ is independently rotated; when the lenses $L_1$, $L_2$, and $L_3$ are integrally rotated; and when the lenses $L_1$, $L_2$, $L_3$, and $L_4$ are integrally rotated. In the same table, the position of the rotation axis is the distance measured from the reticle R.

TABLE 3

| | Angle of Rotation: 36° | | | |
|---|---|---|---|---|
| | Position of Rotation Axis ($\times 1$) ($\times 10^{-3}$) | m-dis ($\times 10^{-3}$) | s-dis | $\delta_{m-s}$ ($\times 10^{-3}$) |
| $L_1$ | 104 | 0.1094 | -0.0324 | -0.0020 |
| $L_1, L_2, L_3$ | 178 | 0.2246 | -0.0726 | -0.5524 |
| $L_1, L_2, L_3, L_4$ | 198 | 0.0015 | -0.0269 | -0.2638 |

If m-dis, s-dis, and asymmetric astigmatism, after constructing the optical system, respectively have the values, m, s, and $\delta$, the following simultaneous equations (4), (5), and (6) are to be satisfied in order to make m-dis, s-dis, and asymmetric astigmatism $\delta_{m-s}$ equal zero by rotating the lens $L_1$ by $\theta_1$, integrally rotating the lenses $L_1$, $L_2$, and $L_3$ by $\theta_{1-3}$, and integrally rotating the lenses $L_1$, $L_2$, $L_3$, and $L_4$ by $\theta_{1-4}$:

$$0.1094/36 \cdot \theta_1 + 0.2246/36 \cdot \theta_{1-3} + 0.0015/36 \cdot \theta_{1-4} = -m \quad (4)$$

$$-0.0324/36 \cdot \theta_1 - 0.0726/36 \cdot \theta_{1-3} - 0.0269/36 \cdot \theta_{1-4} = -s \quad (5)$$

$$-0.002/36 \cdot \theta_1 - 0.5524/36 \cdot \theta_{1-3} - 0.2638/36 \cdot \theta_{1-4} = -\delta \quad (6)$$

By solving the above simultaneous equations, the angles of rotation $\theta_1$, $\theta_{1-3}$, and $\theta_{1-4}$ can be obtained, and accordingly m-dis, s-dis, and asymmetric astigmatism $\delta_{m-s}$ can be made to equal zero.

According to this embodiment, as described above, of optical-axially symmetric components, the magnification and astigmatism aberrations can be corrected by shifting each lens in the optical axis direction, the asymmetric distortion aberrations and asymmetric astigmatism which are the optical-axially asymmetrical eccentric aberrations can be corrected by rotating each lens around a rotation axis perpendicular to the optical axis.

Note that the eccentric aberrations may be corrected using a shifting method in which each lens is moved in a direction perpendicular to the optical axis in place of the tilting method in which each lens is rotated around a rotation axis perpendicular to the optical axis.

Next, the aberrations of the optical system should be measured before adjusting it in the above manner. For example, the apparatus disclosed in Kokai H7-54794 can be used for measuring the aberrations. The apparatus used for measuring the aberration is briefly described hereinafter.

Figure 2:
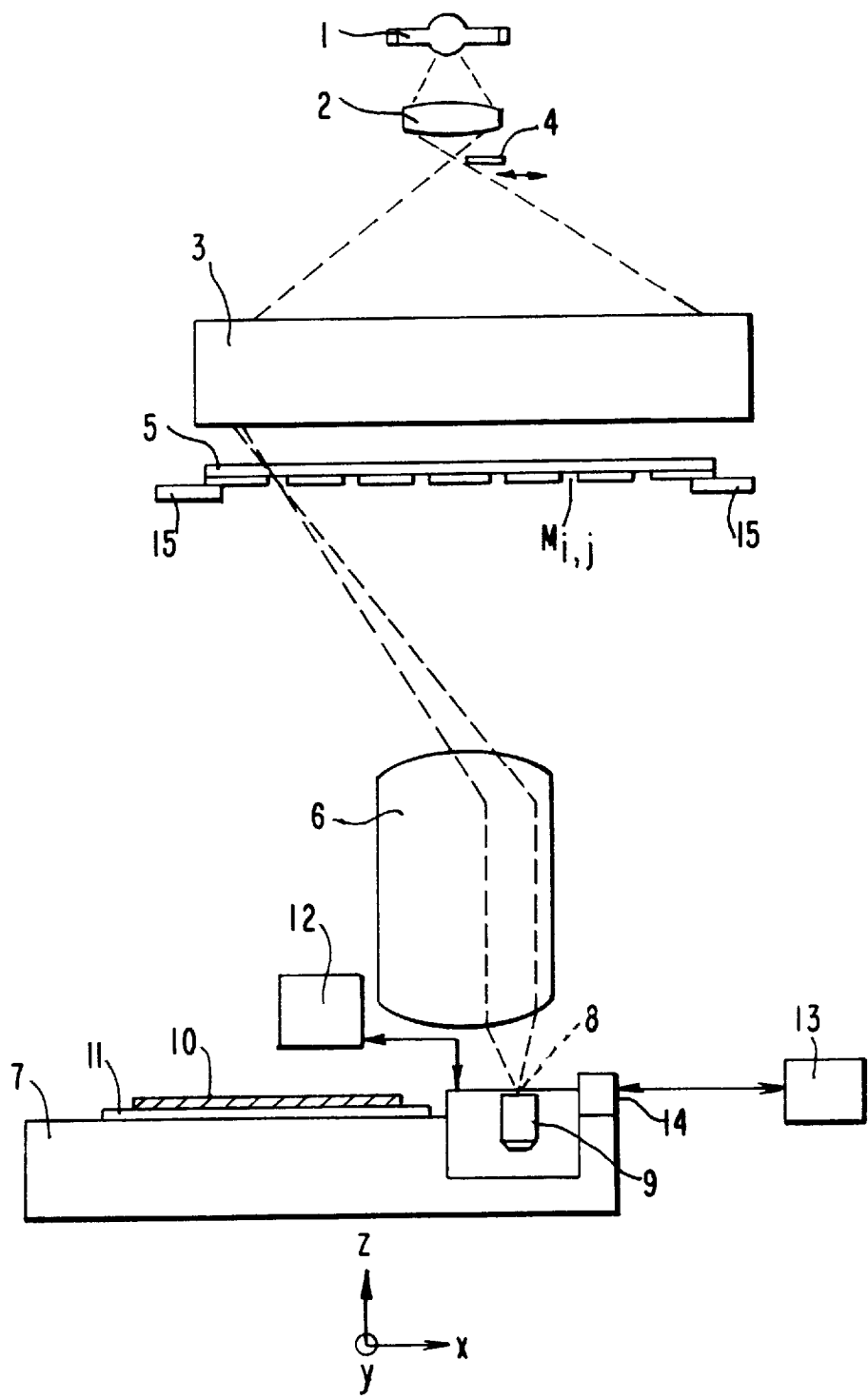
FIG. 2 is a schematic configuration of an aberration measurement apparatus used for an aberration adjustment method in accordance with the principles of the present invention.
Figure 3:
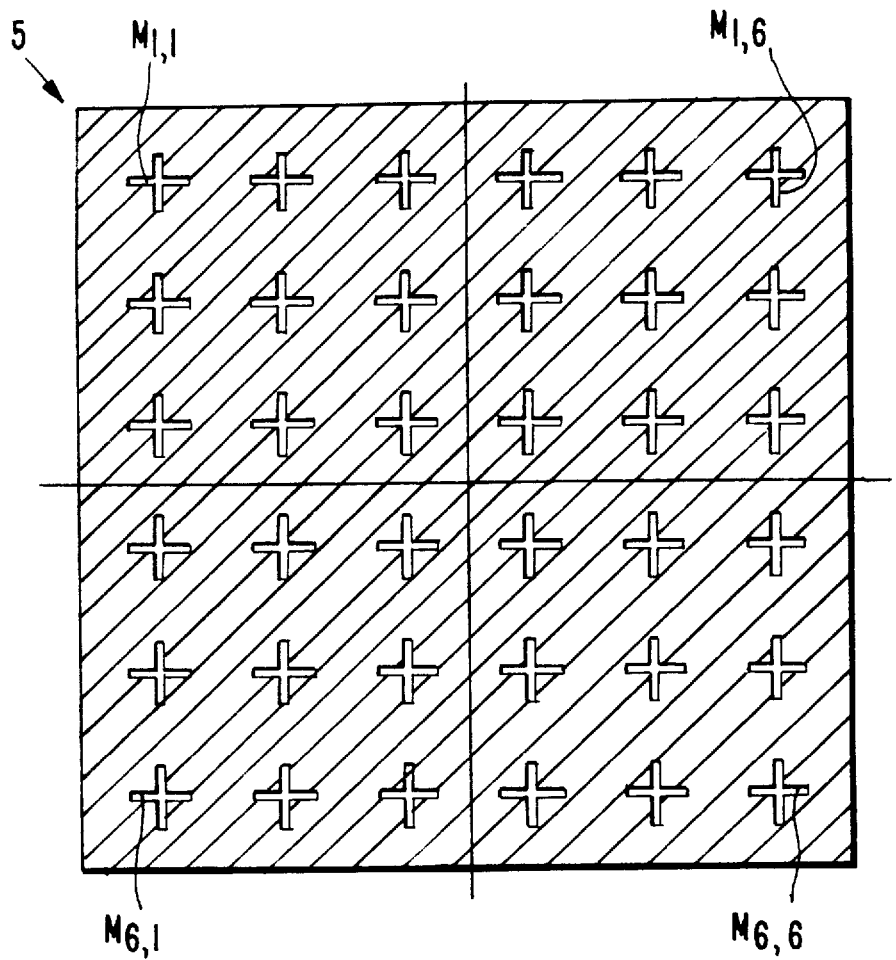
FIG. 3 is a plan view of a test pattern used with the apparatus of FIG. 2.

FIG. 2 shows an aberration measurement apparatus. Illumination light emitted from a light source 1 is gathered through a first condenser lens 2, and then enters a second condenser lens 3. Provided at the converged light point made by the first condenser lens 2 is a shutter 4 for shielding and transmitting the illumination light. The light passing through the second condenser 3 illuminates a test pattern 5. The test pattern 5 is held by a holder 15 which determines the position of the test pattern 5 in the x and y directions perpendicular to the optical axis z. On the back surface of the test pattern 5, crisscross marks $M_{1,1}$ through $M_{6,6}$ are formed so as to guide the light to a plurality of predetermined positions as shown in FIG. 3.

Figure 4:
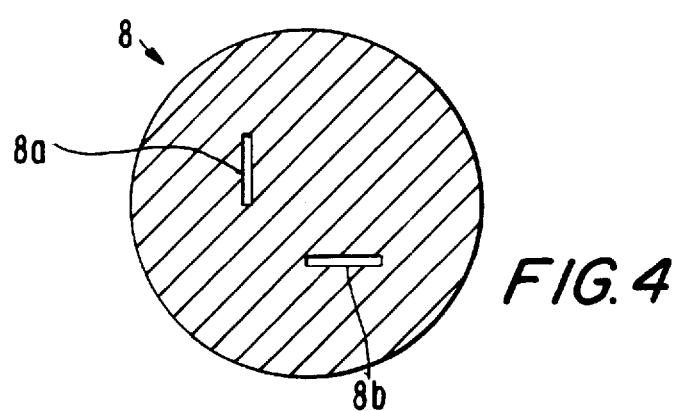
FIG. 4 is a plan view showing an aperture plate.

The light passing through the marks $M_{i,j}$ of the test pattern passes through the reflective-refractive optical system 6 of FIG. 2 whose aberrations are to be measured, and then the image is picked up on an aperture plate 8 held by a stage 7. Provided on the aperture plate 8, as shown in FIG. 4, are an x directional aperture 8a whose width in the x direction is narrow and a y directional aperture 8b whose width in the y direction is narrow. The light passing through these apertures 8a and 8b reaches a photoelectric detector 9 to be photoelectrically converted. A wafer 10 is attached onto the stage 7 via a wafer holder 11. Reflective mirrors 14 are secured at the edges of the stage 7 in the x and y directions, and an interferometer 13 is arranged opposite each reflective mirror 14. Also a gap sensor 12 is provided so as to measure the distance between the reflective-refractive optical system 6 and the aperture plate 8. With this configuration, the position of the stage 7 can be measured in the x, y, and z directions.

Figure 5:
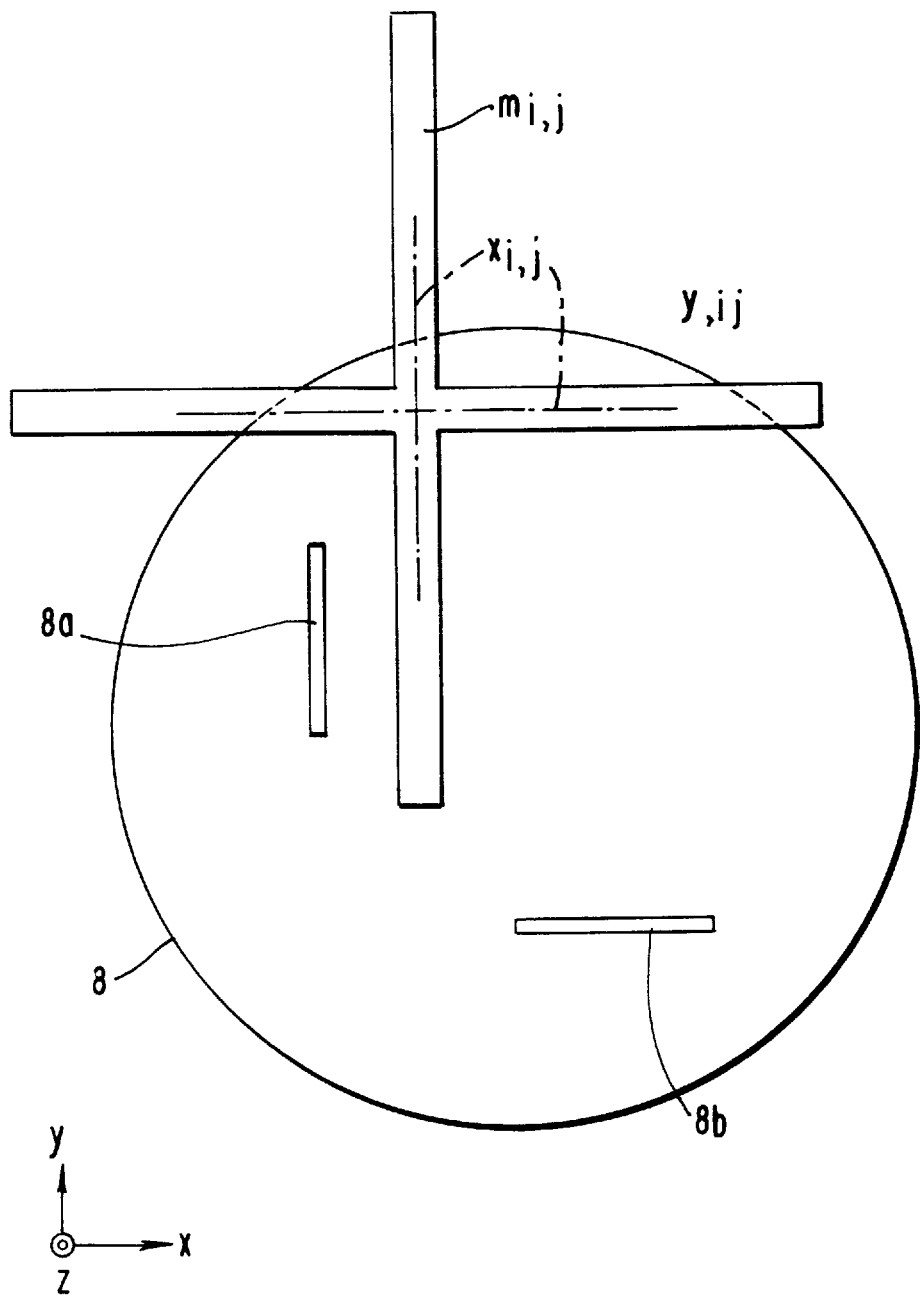
FIG. 5 is a plan view showing the image of one mark of the test pattern of FIG. 3 and the aperture plate of FIG. 4.
Figure 6:
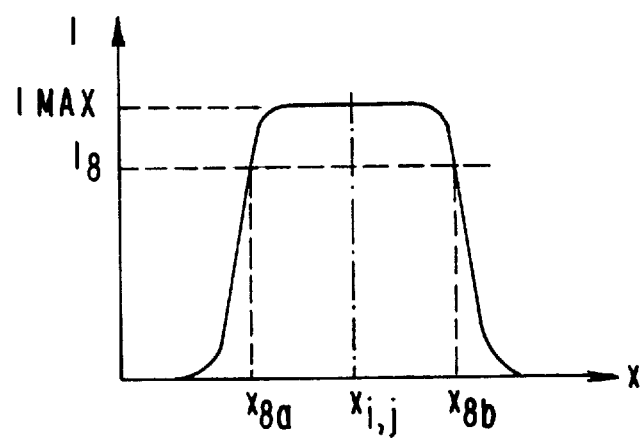
FIG. 6 is a graphical waveform showing the measuring method of the x coordinate of the mark of FIG. 5.

As shown in FIGS. 5 and 6, when scanning the aperture plate 8 in the x direction such that the x-directional aperture 8a crosses an image $m_{i,j}$ of any of the test pattern marks $M_{i,j}$, the output I from the photoelectric detector 9 first increases and then decreases. Therefore, the x coordinate, $x_{i,j}$, of the image of the mark $M_{i,j}$ can be obtained by calculating and averaging the positions $x_{8a}$, $x_{8b}$ (FIG. 6) that indicate the signals, for example, at 80 percent of the peak value $I_{max}$. In the same manner, the y coordinate, $y_{i,j}$, of the image of the mark $M_{i,j}$ can be obtained by scanning the aperture 8b in the y direction.

Figure 7:
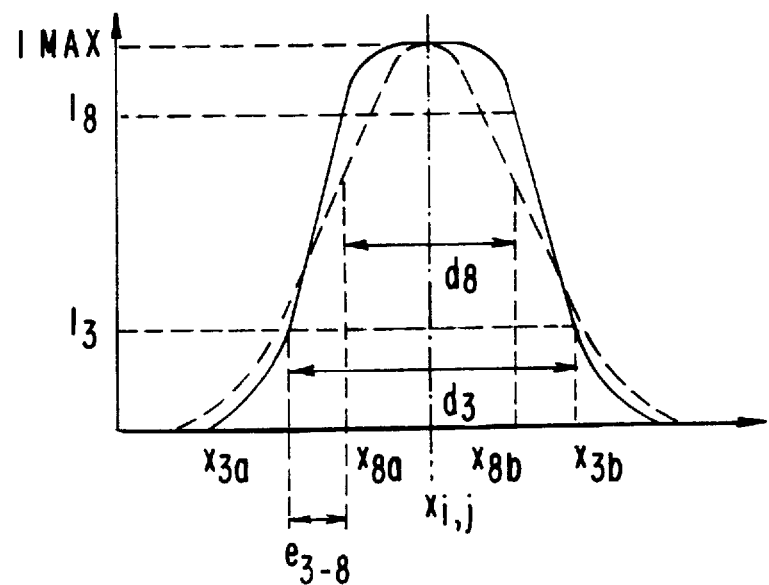
FIG. 7 is a graphical waveform showing the measuring method of the y coordinate of the mark of FIG. 5.

When scanning the defocused position in the x direction by shifting the stage 7 in the z direction, the output of the photoelectric detector 9 changes as shown by dotted lines in FIG. 7 such that the width $d_8$ between the positions $x_{8a}$ and $x_{8b}$ which indicate the signal, for example, at 80 percent of the peak value $I_{max}$, narrows, and the width $d_3$ between the positions $x_{3a}$ and $x_{3b}$ which indicate the signals, for example, at 30 percent of the peak $I_{max}$, widens. For this reason, finding the position where the difference between both widths $(d_3-d_8)$ is the narrowest, by shifting the stage 7 in the z direction, the z coordinate, $z_{i,j}$ of the image of the mark $M_{i,j}$ can be obtained. The z coordinate of the image of the mark $M_{i,j}$ may also be obtained by finding the position where the difference $(e_{3-8})$ between the position $X_{3a}$ indicating the signal at 30 percent of the peak value on the increasing side and the position $x_{8a}$ indicating the signal at 80 percent of the peak value on the same side, becomes the narrowest.

Since all the coordinates, x, y, and z, of the image of a mark $M_{i,j}$ can be obtained in the above manner, the coordinates, x, y, z, of images of all other marks $M_{i,j}$ can be found in the same manner to completely obtain the image of the test pattern. For this reason, each aberration can be completely obtained based on these data. By shifting or rotating the lenses $L_1$, $L_2$, $L_3$, and $L_4$ for correcting the aberrations, the reflective-refractive optical system 6 can be adjusted.

As described, the system incorporating the principles of the present invention can correct various aberrations, such as magnification, astigmatism, asymmetric distortion, and asymmetric astigmatism in the reflective-refractive optical system in which the exposure area is relatively large and the N.A. is large.

Various modifications will become possible for those skilled in the art after receiving the teachings of the present disclosure without departing from the scope thereof.

What is claimed is:

1. A catadioptric optical system comprising:

a first plane;

a first imaging optical system having an unidirectional optical apparatus with an optical axis and at least one lens movable with respect to said optical axis, said unidirectional optical apparatus being arranged to receive light from said first plane and for transmitting said light in only a first direction; and a bidirectional optical apparatus for receiving said transmitted light and for reflecting said light to form an interim image of said first plane;

a second plane;

a second imaging optical system for receiving light from said interim image and reimaging said interim image on said second plane; and a light guide for guiding light from said interim image to said second imaging optical system.

2. A system, as claimed in claim 1, wherein said bidirectional optical apparatus includes a concave mirror and a lens group which transmits both incident light and reflected light with respect to said concave mirror.

3. A system, as claimed in claim 1, wherein said light guide is a mirror.

4. A system, as claimed in claim 1, wherein said lens is movable along said optical axis.

5. A system, as claimed in claim 1, wherein said lens is movable in a direction perpendicular to said optical axis.

6. A system, as claimed in claim 1, wherein said lens is rotatable about an axis perpendicular to said optical axis.

7. A method of adjusting the catadioptric optical system of claim 1, comprising the steps of:

arranging a test pattern on said first plane;

detecting a partial imaging position of said test pattern on said second plane by means of a position detector;

moving said position detector through a plurality of positions to detect a plurality of partial imaging positions of said test pattern on said second plane; and moving at least said lens to a position based on said plurality of partial imaging positions.

8. A system, as claimed in claim 1, wherein a reticle having a circuit pattern is arranged in said first plane and a wafer having a photosensitive substrate is placed in said second plane.

* * * * *